Figure 1:
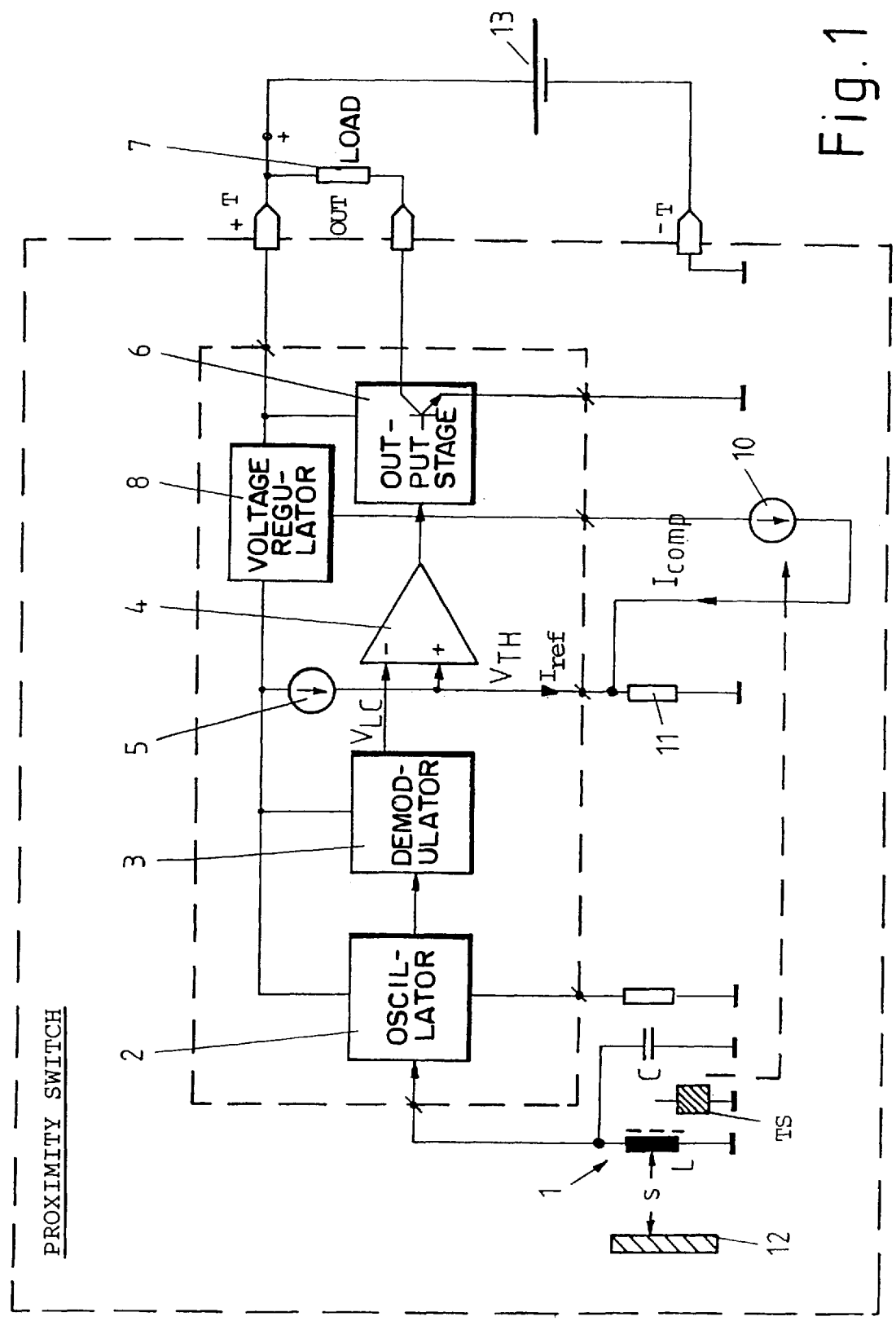

United States Patent

Fericean et al.

[11] Patent Number: 5,818,129
[45] Date of Patent: Oct. 6, 1998

[54] NON-CONTACT PROXIMITY SWITCH AND METHOD FOR PROGRAMMING IT

[75] Inventors: Sorin Fericean, Leonberg; Ernst Gass, Stuttgart, both of Germany

[73] Assignee: Gebhard Balluff GmbH & Co., Neuhausen/Fildern, Germany

[21] Appl. No.: 685,714

[22] Filed: Jul. 24, 1996

[30] Foreign Application Priority Data

Jul. 25, 1995 [DE] Germany ......................... 195 27 174.2

[51] Int. Cl.[6] ................................................ H01H 36/00
[52] U.S. Cl. .......................... 307/116; 307/117; 361/179; 361/182
[58] Field of Search .................................... 307/116, 117; 361/179, 180, 181, 182; 340/551, 561, 562; 327/517

[56] References Cited

U.S. PATENT DOCUMENTS

| 4,672,230 | 6/1987 | Spahn | 307/116 |
| 5,264,733 | 11/1993 | Tigges | 307/116 |
| 5,278,523 | 1/1994 | Kriz | 331/176 |
| 5,487,013 | 1/1996 | Luber | 364/480 |

Primary Examiner—William M. Shoop, Jr.
Assistant Examiner—Albert W. Paladini
Attorney, Agent, or Firm—Darby & Darby

[57] ABSTRACT

In order to improve a non-contact proximity switch, and a method for programming it, with an resonant circuit that can be influenced by objects approaching from outside and an evaluation circuit to generate an output signal as a function of an output voltage of the resonant circuit that exceeds a predefined threshold value, and with standard terminals, in such a way that the proximity switch can be used at different temperatures and operates accurately independently of the ambient temperature and independently of other trouble influences, it is proposed that a temperature sensor be arranged in the vicinity of the resonant circuit; and that a compensation circuit comprise a circuit unit, downstream from the temperature sensor, which outputs a compensation quantity, dependent on the sensed temperature, that is delivered to a comparator to be compared with the output voltage of the oscillator circuit and, when identity exists, to enable the output signal; and that the compensation magnitude for compensating for the temperature dependence and for other influences be capable of being repeatedly modified in temperature-dependent fashion from outside using the "teach-in" method by means of an external programming device that can be connected to the standard terminals of the proximity switch, and stored, with the proximity switch in its completely assembled state.

14 Claims, 3 Drawing Sheets

NON-CONTACT PROXIMITY SWITCH AND METHOD FOR PROGRAMMING IT

The invention relates to a non-contact proximity switch as defined in the preamble of claim 1.

A non-contact proximity switch of this kind comprises an oscillator circuit that can be influenced by objects approaching from outside, and evaluation circuits to generate an output signal as a function of an output voltage of the oscillator circuit that exceeds a predefined threshold value.

In this context the object approaching from outside is intended to be reliably detected at a specific distance, which can assume quite a large magnitude.

Proximity switches of this kind are used under a wide variety of service conditions, in particular at a wide variety of temperatures. It proves to be problematic, especially when calibrating for large switching distances, that the output voltage of the oscillator circuit depends on the temperature at which the proximity switch is used. Because of this temperature dependence of the output voltage of the oscillator circuit, reliable detection of an object approaching the proximity switch is no longer possible, since the distances at which an object approaching the proximity switch from the outside can still reliably be recognized also depend on temperature. Thus objects approaching the proximity switch may, for example, just be detected at a certain ambient temperature, while at a slightly different ambient temperature they may, in some circumstances, already be undetectable. In other words the proximity switch becomes inaccurate because of this temperature dependence, and can basically be used reliably only at one single temperature.

The object of the invention is to eliminate the aforesaid disadvantages and provide a proximity switch with large response distances that can be used at different temperatures and moreover functions accurately independently of the ambient temperature and independently of other interfering influences (for example those produced by tolerances in the components used), i.e. that reliably recognizes the approach of an object at a specific predefined distance.

The object is achieved, in a non-contact proximity switch with a resonant circuit that can be influenced by approaching objects, and an evaluation circuit which generates an output signal indicative of the resonant circuit output voltage exceeding a predetermined threshold value.

Compensation for temperature dependence is achieved, in particularly advantageous fashion, by the fact that given a constant distance of an object approaching the proximity switch, the threshold value can be configured variably as a function of temperature. This makes possible reliable switching of the proximity switch at a predefined distance of the object approaching the proximity switch, at a wide variety of temperatures.

With the proximity switch according to the invention, the threshold value is therefore advantageously variable as a function of temperature at a predefined constant detection distance, while in contrast thereto, with non-contact proximity switches with large response distances according to the prior art, the detection distance varies as a function of temperature at a predefined constant threshold value.

It is also particularly advantageous that the compensation quantity for compensating for the temperature dependence and for tolerances in the components constituting the proximity switch can be modified and stored in temperature-dependent fashion from outside with the proximity switch in its completely assembled state, using the "teach-in" method by means of an external programming device that can be connected to existing terminals (standard terminals) of the proximity switch. Any influences caused by the assembled conditions of the proximity switch, by manufacturing tolerances of the components used, and/or by the ambient temperature, can thereby be easily, quickly, and economically eliminated.

The invention further concerns a method for programming a non-contact proximity switch.

In this context its object is to prepare the proximity switch, before its first entry into service, in such a way that it is usable in as wide a temperature range as possible, and thereby allows reliable detection of an approaching object at a predefined distance, independently of environmental influences.

Figure 3:
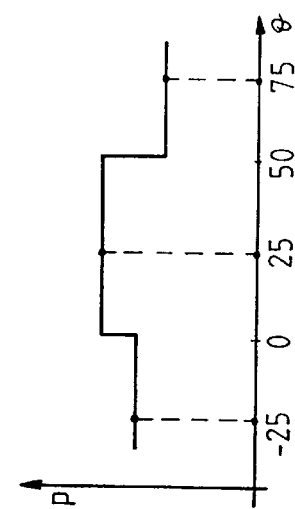
Figure 2A:
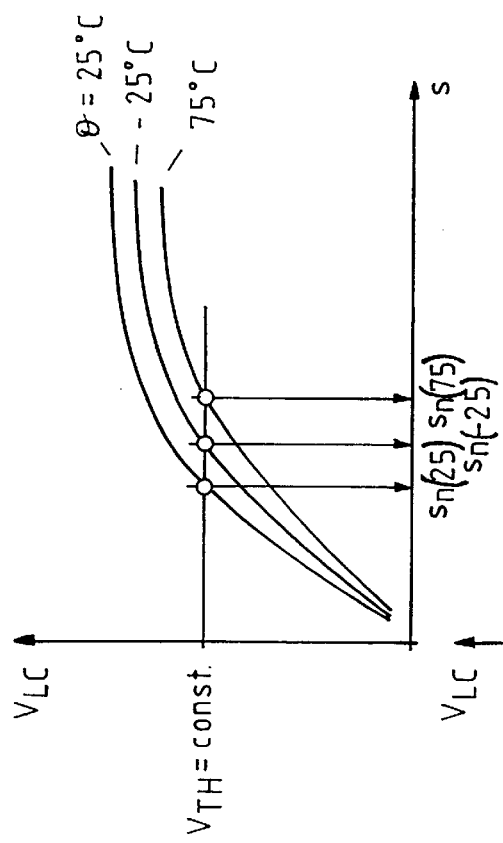
Figure 2B:
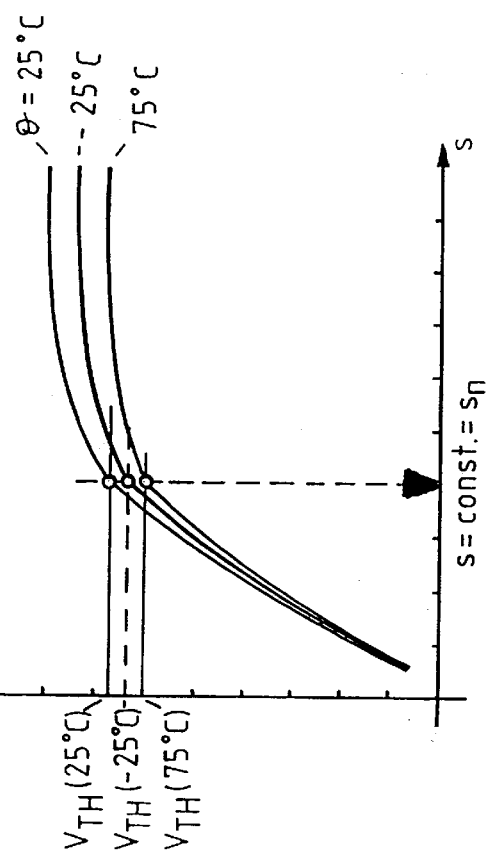
Figure 4:
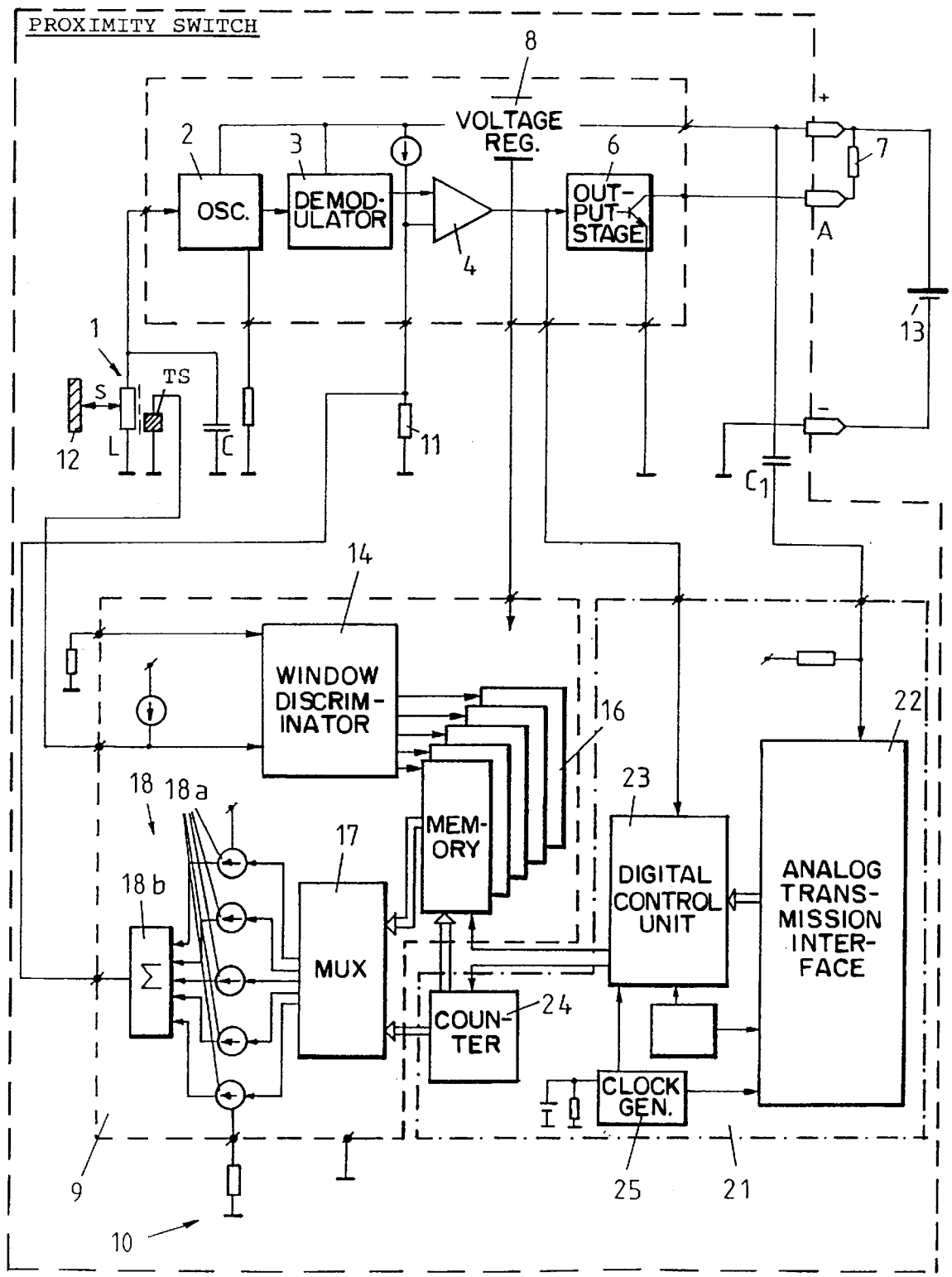

FIG. 1 shows a basic circuit diagram of a proximity switch with compensation for temperature dependence;

FIGS. 2a and 2b schematically show the change in the output voltage of the oscillator circuit as a function of temperature and the distance of the approaching object;

FIG. 3 schematically shows the change in compensation current as a function of temperature; and FIG. 4 shows a detailed basic circuit diagram of a proximity switch, with a compensation circuit which comprises a circuit unit for compensating for temperature dependence, and a programming circuit for programming the proximity switch.

As is shown in FIG. 1, a non-contact proximity switch comprises a resonant circuit 1 consisting of a coil L and a capacitor C. The proximity switch has the following standard terminals: terminals (+T/−T) for providing supply voltage, and a terminal OUT for output of an output signal. Resonant circuit 1 is connected in a manner known in the art, to an oscillator 2 and a demodulator 3, which outputs an output voltage $V_{LC}$ that in turn is delivered to one input of a comparator 4. The output of comparator 4 is connected to an output stage 6 to activate a load 7 present at output OUT. Also provided are a voltage regulator 8 known in the art, and a temperature-independent internal current source 5 to generate threshold voltage value $V_{TH}$. The entire circuit is substantially temperature-dependent, in particular because of the temperature dependence of output voltage $V_{LC}$ of the resonant circuit.

As is further apparent from FIG. 1, a temperature sensor TS, e.g. a diode, is arranged in the vicinity of resonant circuit 1, specifically in the vicinity of coil L. Temperature sensor TS activates a compensation circuit 10, downstream from it, which outputs a compensation quantity in the form of a compensation current $I_{comp}$. This compensation current $I_{comp}$ modifies threshold value $V_{TH}$, which is present at the second input of comparator 4, as a function of temperature. In comparator 4, output voltage $V_{LC}$ is compared with threshold value $V_{TH}$; threshold value $V_{TH}$, caused by the voltage drop across a resistor 11, results from the sum of a constant current $I_{ref}$ generated by a current source 5 and compensation current $I_{comp}$. When output voltage $V_{LC}$ is identical to threshold value $V_{TH}$, comparator 4 outputs an output signal to output stage 6, so that load 7 is switched. This is always the case when an object 12 approaches coil L to within a specific response distance $S_n$. Output voltage $V_{LC}$ depends on ambient temperature $\theta$ of the proximity switch.

The temperature dependence of output voltage $V_{LC}$, and thus the oscillation characteristics of resonant circuit 1 as a function of distance s and temperature $\theta$, are depicted schematically in FIG. 2a.

As is evident from FIG. 2a, output voltage $V_{LC}$ changes with temperature $\theta$, in particular because the temperature behaviour of the coil which is strong and difficult to anticipate, so that for a predefined constant threshold value $V_{TH}$, a different detection distance $s_n$—at which an object approaching the proximity switch leads to an output signal of comparator 4—results as a function of temperature θ in each case. To prevent this, in a circuit as shown in FIG. 1 the temperature of the coil is sensed by means of temperature sensor TS and taken into account by compensation circuit 10, and threshold value $V_{TH}$ is varied in such a way that at each temperature a constant switching distance ($s_n$= constant) results (FIG. 2b).

The temperature variation of compensation current $I_{comp}$ output by compensation circuit 10 is depicted schematically in FIG. 3. As is apparent from FIG. 3, compensation current $I_{comp}$ changes in steps as a function of ambient temperature θ. As a result threshold value $V_{TH}$ also varies, so that the proximity switch always switches, at different temperatures θ, at the constant distance $s_n$.

FIG. 4 depicts in detail the circuitry of compensation circuit 10 of the proximity switch, which comprises an internal circuit section 9 (essentially a compensation current generator) and an internal circuit 21.

As is shown from FIG. 4, circuit unit 9 comprises in turn a window discriminator 14, for example an analog-digital converter, which is directly downstream from temperature sensor TS. Window discriminator 14 is used to convert the temperature θ sensed by temperature sensor TS. It is also used to select the address a memory means 16, for example an EEPROM, downstream from it.

The digital values of compensation current $I_{comp}$ are stored—each allocated to individual addresses—in memory means 16. As a function of the sensed temperature θ and the address selected as a consequence thereof, memory means 16 outputs a quantity in the form of a parallel digital word to a multiplexer 17, downstream from memory means 16, which in turn controls a current source 18 downstream from it, which for its part comprises individual binary-weighted current sources 18a that can be activated in binary fashion, and a current adder 18b downstream from them. By means of this circuit arrangement, compensation current $I_{comp}$ is output by adder 18b via multiplexer 17, current sources 18a and, as described above, is delivered via resistor 11 to an input of comparator 4. The operation of multiplexer 17, current sources 18a and current adder 18b corresponds to a digital-analog current convertion.

If, for example, ambient temperature θ now changes, window discriminator 14 causes the value of an address of memory means 16 associated with that temperature θ to be read out; this in turn causes multiplexer 17 to output a modified compensation current $I_{comp}$ via current sources 18a and adder 18b. In other words for every ambient temperature θ a different threshold value $V_{TH}$ is present, which is compared with output voltage $V_{LC}$ of the oscillator circuit in comparator 4 and, if the two signals are identical, leads to an output signal which then causes load 7 to switch on.

This makes it possible for a switching behaviour of the proximity switch always to be implemented, independently of temperature θ, at a predefined switching distance $s_n$ of an object approaching the proximity switch.

In order to store the appropriate compensation values to the corresponding addresses of memory means 16, the proximity switch must be programmed before first entering service.

This is done by means of a "teach-in" method which is best explained with reference to internal programming circuit 21, also depicted in FIG. 4, which is part of compensation circuit 10 of the proximity switch.

As is shown in FIG. 4, internal programming interface 21 comprises an analog transmission interface 22 and a digital control unit 23, connected to the latter and to the output of comparator 4, which control the memory 16 or a counter 24. During programming the counter 24 activates the binary-weighted current sources 18a via multiplexer 17.

Analog transmission interface 22 can be activated by an external programming device (not depicted), known in the art, which is simply inserted between the terminals (standard terminals) of the proximity switch (+T/–T, OUT) and the terminals of supply voltage source 13 and load 7. The programming device is used to generate modulated data that, in the present case, initiate the method for programming the proximity switch.

To program the proximity switch using a teach-in method, object 12 is adjusted in a fixture at the switching distance $s_n$, with reference to coil 1, that is to be programmed, and the external programming device is temporarily inserted between the sensor terminals (standard terminals) (+T, –T, and OUT) and the terminals of supply voltage source 13 or load 7.

Programming is performed at each compensation temperature (for example, as depicted in FIG. 3, at θ=–25° C., 25° C., and 75° C.).

The method for programming at a predefined temperature comprises the following steps:

Programming is started by actuating the external programming device. The external programming device consequently generates a start command that is superposed on one of the proximity switch connection leads and so modulated onto the supply voltage or the output signal of the proximity switch. The start command transmitted in this manner is applied in the proximity switch, via a coupling capacitor $C_1$, to the input of analog transmission interface 22.

Analog transmission interface 22 demodulates the received signal, and recognizes and checks the signal.

If transfer has occurred correctly, digital control unit 23 immediately connects the multiplexer 17 to counter 24 and delivers an enabling signal for the clock signals generated by a clock generator 25. The clock pulses cause a step by step count-up or count-down of the counter 24. The contents of counter 24 is increased or decreased, so that multiplexer 17, activated by the counter, causes activatable current source 18 to increase or reduce compensation current $I_{comp}$.

Threshold value $V_{TH}$ present at the non-inverting input of comparator 4 is increased or reduced stepwise in this manner until it exceeds or falls below the value of the output voltage of oscillator circuit $V_{LC}$ present at the corresponding temperature, which causes comparator 4 to switch over.

Digital control unit 23, controlled by the internal output signal output by comparator 4 and serving as feedback, stops counter 24 and thus stops the increase or reduction in compensation current $I_{comp}$.

In the last programming step, digital control unit 23 provides for transfer of the counter contents into the memory location of memory means 16 addressed at that temperature by window discriminator 14, and for the switchover of multiplexer 17 from counter 24 to the addressed memory location of memory means 16. This creates a steady-state connection between that memory location of memory means 16 and activatable current source 18.

In normal operation the previously stored digital values are selected dependently on temperature. These ensure, by means of multiplexer 17, specific settings of the activatable current source 18 and thus values for compensation current $I_{comp}$.

It is particularly advantageous that programming can be performed, using the "teach-in" method, with the non-contact proximity switch in its completely assembled state.

Each proximity switch can thus be adjusted to its own specific environmental conditions, so that the proximity switch functions accurately independently of ambient temperature θ, and independently of other interfering influences that might result, for example, from tolerances in the components used and/or an unknown temperature behaviour of the coil.

We claim:

1. A non-contact proximity switch which is compensated to substantially eliminate temperature variations, said switch comprising:

a resonant circuit which is influenced by an approaching object and produces a resonant circuit voltage indicative of the proximity of said object;

a voltage generator which produces a predetermined threshold voltage;

an evaluation circuit including a comparator having a first input which receives said resonant circuit voltage and a second input which receives said predetermined threshold voltage, said comparator having an output at which is produced a comparator output signal indicative of the equality of said resonant circuit voltage and said threshold voltage, said comparator output signal indicating the approach of said object at a predetermined distance;

a temperature sensor positioned in the vicinity of said resonant circuit and producing a temperature indication; and a compensation circuit which produces a compensation voltage dependent on said temperature indication, said compensation voltage being combined with said threshold voltage to thereby modify said threshold voltage in dependence on said temperature indication, said compensation voltage being repeatedly determined at a plurality of different temperature indications and stored in said compensation circuit for subsequent retrieval.

2. The non-contact proximity switch of claim 1, wherein said compensation circuit further comprises a compensation current generator including:

a window discriminator which receives at its input said temperature indication and which provides at its output a corresponding memory address signal;

a memory circuit which receives said memory address signal and outputs a corresponding current selection signal;

a multiplexer which receives said current selection signal; and a current source which outputs a predetermined current in accordance with said current selection signal.

3. The non-contact proximity switch of claim 2, wherein said compensation circuit further comprises:

an internal programming circuit which is activated by an external programming device, said internal programming circuit comprising:
   an analog transmission interface;
   a digital control unit which receives as its input a control signal from said analog transmission interface and said comparator output signal, and which provides at its output a memory control signal and a counter control signal.

4. The non-contact proximity switch of claim 2, wherein said window discriminator comprises an analog-to-digital converter.

5. The non-contact proximity switch of claim 2, wherein said memory circuit includes an EEPROM.

6. The non-contact proximity switch of claim 1, wherein said temperature sensor comprises a diode arranged adjacent a coil of said resonant circuit, said diode being provided with a substantially constant current from said compensation circuit.

7. A method for programming a non-contact proximity switch to substantially reduce temperature variations, said switch being of the type having proximity switch terminals, at least one activatable current source, a comparator, an output signal, a compensation current, a memory, a counter, and an external programming device, said method comprising the steps of:

(a) initiating said non-contact proximity switch using a start command from said external programming device transmitted via said proximity switch terminals;

(b) generating said compensation current using said at least one activatable current source, said compensation current being used to adjust a threshold voltage which is provided as an input to said comparator;

(c) adjusting said compensation current which in turn adjusts said threshold voltage input to said comparator until said output signal is generated by said comparator indicating a change in state with respect to the relative values of said threshold voltage and a resonant circuit voltage indicative of the proximity of object ; and (d) storing into said memory a value corresponding to said compensation current at which said output signal is generated.

8. The method according to claim 7 further comprising the step of repeating steps (a)–(d) at a different predefined temperature.

9. The method according to claim 7 further comprising the steps of:

(e) positioning an object at a predetermined distance from said proximity switch;

(f) generating a start command from said external programming device;

(g) enabling said counter to produce an output count signal;

(h) using said output count signal to set an activatable current source to generate a compensation current which is used to generate a compensation voltage which is combined with a threshold voltage to thereby produce a modified threshold voltage:

(i) providing a resonant circuit which produces a resonant circuit output voltage indicative of the positioning of said object;

(j) using a comparator to generate an output signal indicative of the relative values of said resonant circuit voltage and said modified threshold voltage;

(k) stopping said counter when said comparator output signal changes state indicating a change in the relative values of said resonant circuit voltage and said modified threshold voltage, and storing said corresponding counter output count signal in said memory;

(l) otherwise, advancing said counter to a next output count signal and repeating steps (h) through (k).

10. The method according to claim 9 comprising the further steps of:

removing said external programming device after completion of programming;

outputting digital values in a temperature-dependent manner from said memory; and delivering said digital values to said at least one multiplexer and thus to said at least one activatable current source.

11. A method for programming a non-contact proximity switch of the type having proximity switch terminals, a comparator, and an external programming device, comprising the steps of:

(a) transmitting a start command from said external programming device to said proximity switch terminals;

(b) generating a compensation current ($I_{comp}$) and a corresponding threshold voltage ($V_{TH}$), at a predetermined temperature, using at least one activatable current source;

(c) generating an output voltage ($V_{LC}$) from an oscillator circuit, said output voltage ($V_{LC}$) dependent on an ambient temperature (theta) of said proximity switch;

(d) comparing said output voltage ($V_{LC}$) to said threshold voltage ($V_{TH}$) using said comparator;

(e) adjusting said compensation current to produce an adjusted compensation current which causes a comparator output signal to switch states;

(f) terminating adjustment of said compensation current when said comparator output signal switches states; and (g) storing in a memory said adjusted compensation current value when said adjustment of said compensation current is terminated.

12. The method according to claim 11 further comprising the step of repeating steps (a)–(g) each at a different predetermined temperature.

13. The method according to claim 11 further comprising the steps of:

(h) adjusting the contents of a counter;

(i) selecting at least one output of a multiplexer using said counter;

(j) providing said compensation current ($I_{comp}$) using said at least one activatable current source connected to the output of said multiplexer;

(k) controlling a digital control unit using said comparator output signal;

(l) stopping said counter when said comparator output signal switches states, otherwise repeating steps (h)–(l) until said digital control unit stops the counter; and (m) storing the value of the compensation current ($I_{comp}$) corresponding to said counter contents.

14. The method according to claim 13 further comprising the steps of:

removing said external programming device after completion of programming;

selecting digital values corresponding to said ambient temperature from said memory; and delivering said digital values to said multiplexer and thus to said at least one activatable current source thereby adjusting the value of said compensation current ($I_{comp}$).

* * * * *